(12) United States Patent
Atherton

(10) Patent No.: US 8,267,171 B2
(45) Date of Patent: Sep. 18, 2012

(54) APPARATUS AND METHOD OF MONITORING AN ALTERNATING CURRENT COMPONENT OF A DOWNHOLE ELECTRICAL IMBALANCE VOLTAGE

(75) Inventor: Eric J. Atherton, Witney (GB)

(73) Assignee: Baker Hughes Incorporated, Houston, TX (US)

( * ) Notice: Subject to any disclaimer, the term of this patent is extended or adjusted under 35 U.S.C. 154(b) by 335 days.

(21) Appl. No.: 12/641,583

(22) Filed: Dec. 18, 2009

(65) Prior Publication Data
US 2010/0155057 A1 Jun. 24, 2010

Related U.S. Application Data

(60) Provisional application No. 61/140,261, filed on Dec. 23, 2008.

(51) Int. Cl.
*E21B 43/12* (2006.01)
(52) U.S. Cl. .............. 166/250.01; 166/250.15; 166/105; 417/44.11
(58) Field of Classification Search ............. 166/250.01, 166/250.15, 62, 105; 417/423.3, 44, 11
See application file for complete search history.

(56) References Cited

U.S. PATENT DOCUMENTS

| 6,469,636 | B1 | 10/2002 | Baird |
| 6,534,949 | B2 | 3/2003 | Szczesny |
| 6,585,041 | B2 * | 7/2003 | Crossley ......................... 166/53 |
| 6,586,900 | B2 * | 7/2003 | Rider et al. .................... 318/459 |
| 2005/0281680 | A1 * | 12/2005 | Schulz ....................... 417/44.11 |
| 2008/0187444 | A1 | 8/2008 | Molotkov |
| 2008/0212691 | A1 | 9/2008 | Atherton |
| 2008/0291708 | A1 | 11/2008 | Teichmann |

FOREIGN PATENT DOCUMENTS

WO WO 2005048459 A2 * 5/2005

OTHER PUBLICATIONS

Phoenix Select, ESP Monitoring Systems, Reliable and multifunctional monitoring of ESP systems, Schlumberger, www.slb.com, 2 pages.

* cited by examiner

*Primary Examiner* — William P Neuder
*Assistant Examiner* — Richard Alker
(74) *Attorney, Agent, or Firm* — Bracewell & Giuliani LLP

(57) ABSTRACT

An apparatus and method are provided for monitoring and controlling a power system of an electrical submersible pump assembly. A sensor monitors an alternating current component of a downhole electrical imbalance voltage at a neutral point of a motor of the electrical submersible pump assembly. The sensor measurement is transmitted to a controller at the surface. The controller analyzes the alternating current component of the downhole electrical imbalance voltage and then adjusting an operation of the electrical submersible pump assembly, or scheduling maintenance, accordingly. Also, a model of a power system of an electrical submersible pump assembly is created to predict an alternating current component of a downhole electrical imbalance voltage. The model is modified as necessary responsive to measurements from the sensor. A controller adjusts surface currents according to the model of the power system to match downhole motor drive currents to thereby optimize the power system.

11 Claims, 5 Drawing Sheets

APPARATUS AND METHOD OF MONITORING AN ALTERNATING CURRENT COMPONENT OF A DOWNHOLE ELECTRICAL IMBALANCE VOLTAGE

RELATED APPLICATIONS

This application claims priority to and the benefit of U.S. Provisional Patent Application No. 61/140,261, filed Dec. 23, 2008, titled "Downhole Electrical Imbalance Detection," which is incorporated herein by reference in its entirety.

BACKGROUND

1. Field of Invention

The present invention relates in general to diagnostics and performance analysis of electrical submersible pump (ESP) assemblies and, in particular, to an improved method and apparatus for monitoring the power system to an ESP assembly.

2. Background

Electrical submersible pump (ESP) assemblies are often used in hydrocarbon producing wells for enabling or improving the flow of fluids from within the well bore to the surface. A typical ESP assembly includes a centrifugal pump which is driven by a three-phase AC motor, both located in the well bore. A typical ESP assembly also includes a power source located at the surface, often comprising a variable speed drive (VSD) and an output transformer. Connecting the motor to the power source, i.e., the output transformer, is a cable. Because the motor can be a very long distance from the power source, e.g., the output transformer and variable speed drive, the voltage drop in the cable can be significant.

Moreover, in certain wells, flat rather than round cable can be used to save space and satisfy the available geometry. Flat cable is constructed with the three conductors in a line when viewed in cross section. Round cable is constructed with the three conductors in a triangular configuration when viewed in cross-section. Round cable can be substantially electrically symmetrical from phase to phase. That is, mutual inductance and capacitance can be substantially the same for phases A-B, B-C, and C-A in a round cable, as understood by those skilled in the art. This is not the case for flat cable construction. For long cable runs, and particularly for long cable runs of flat cable, phase imbalance can cause substantial voltage and current imbalances between the phases, leading to less then optimum performance.

The power system of typical ESP assembly can be divided into three main sections: the primary side, surface; the secondary side, surface; and the secondary side, downhole. Conventionally, only the first of these sections—the primary side, surface—is monitored. Characteristics for the remaining sections are inferred. For example, a variable speed drive will monitor and control the current and voltages in all three phases of the primary side. On, the secondary side, the current and voltages are inferred via the output transformer characteristics. Not all secondary side characteristics are detectable on the primary side, however. For example, a phase-to-ground short on the secondary side can lead to a large surface voltage imbalance on the secondary side, without the voltage imbalance being detectable on the primary side. Because the star point of an ESP motor is subsurface, there has been no convenient way of monitoring the out-of-balance voltage.

There is a commercial need for improvement in power systems for ESP assemblies. The oilfield ESP assembly is an expensive system, and failures are costly, both in terms of equipment replacement cost and also lost oil production. Any improvements that can assist in the prevention of failure or increase in the run life of the ESP assembly are of substantial economic benefit. Moreover, the energy costs of running ESP assemblies are substantial, and any system that can improve the overall electrical efficiency of the ESP assembly can reduce running costs.

SUMMARY OF INVENTION

Applicant recognizes deficiencies in the prior art approaches of monitoring and controlling only the primary side of the power system of an electrical submersible pump assembly. Accordingly, example embodiments can provide a method and apparatus to monitor the secondary side voltages of the power system at the surface and to provide downhole electrical imbalance detection for an electrical submersible pump assembly. Applicant further recognizes that monitoring the downhole electrical imbalance voltage can provide insights into the system dynamics and can enable improvements and optimization in the electrical submersible pump assembly.

Example embodiments can provide an apparatus and method for improved diagnostics and performance analysis of electrical submersible pump assemblies using real-time information, including downhole electrical imbalance detection. Example embodiments can provide for electrical imbalance detection by direct voltage monitoring of the secondary side phase voltages of the power system at the surface. Monitoring secondary side phase voltages at the surface, however, does not give full information about the downhole voltages, as there is a long power cable in between these points. Example embodiments can further include monitoring the electrical imbalance voltage at the downhole star point, i.e., neutral point, of the three-phase power system and transmitting the voltage to the surface, perhaps along with the other standard ESP parameters, such as temperature and pressure. The electrical imbalance at the star point can be measured, for example, by using a sense winding on a downhole choke. This measurement provides useful information regarding the initial condition of the system, such as electrical balance, and how this condition changes over time to thereby provide insights into the system dynamics, enable optimization, and improve future well designs.

Example embodiments can provide a method of monitoring a power system of an electrical submersible pump assembly. The method includes monitoring an alternating current component of a downhole electrical imbalance voltage at a neutral point of a motor of an electrical submersible pump assembly. The method includes transmitting the alternating current component of the downhole electrical imbalance voltage to the surface. The method includes analyzing the alternating current component of the downhole electrical imbalance voltage. The method further includes adjusting an operation of the electrical submersible pump assembly responsive to the analyzed alternating current component of the downhole electrical imbalance voltage.

The step of monitoring the alternating current component of the downhole electrical imbalance voltage can includes a sense winding on a downhole inductor attached to the neutral point, or a high-impedance potential divider capacitively coupled to the neutral point and a voltage sensor. The step of transmitting the alternating current component of the downhole electrical imbalance voltage to the surface involves transmitting a peak-to-peak electrical imbalance voltage, or an average electrical imbalance voltage.

Example embodiments can provide a method of monitoring a power system of an electrical submersible pump assembly. The method can include creating a model of a power system of an electrical submersible pump assembly to predict an alternating current component of a downhole electrical imbalance voltage at a neutral point of a motor of an electrical submersible pump assembly. The method can include measuring the alternating current component of the downhole electrical imbalance voltage at the neutral point of the motor of the electrical submersible pump assembly, then transmitting the measurement to the surface so that the model of the power system can be verified. The method can include modifying the model of the power system as necessary and then adjusting surface currents according to the model of the power system to match downhole motor drive currents to thereby optimize the power system.

Example embodiments can provide an electrical submersible pump (ESP) assembly. The ESP assembly can include a pump located in a well bore, a motor located in the well bore and attached to the pump, a variable speed drive located at the surface of the well bore, an output transformer located at the surface of the well bore and connected to the variable speed drive, and a power cable to connect the motor to the output transformer. The ESP assembly can include a downhole sensor to measure an alternating current component of a downhole electrical imbalance voltage at a neutral point of the motor. The ESP assembly can include a controller to analyze the alternating current component of the downhole electrical imbalance voltage. The controller can have at least a processor and a tangible memory. The ESP assembly can include a program product operable on the controller and stored in the memory. The program product includes a set of instructions that, when executed by the controller, cause the controller to perform the various operations. The operations can include analyzing the alternating current component of the downhole electrical imbalance voltage responsive to a measurement from the sensor, adjusting an operation of the electrical submersible pump assembly responsive to the analyzed alternating current component of the downhole electrical imbalance voltage, and scheduling maintenance accordingly.

The improvements and enhancements to the oilfield ESP assembly described herein can assist in the prevention of failure and in the increase of the run life of the ESP assembly, resulting in substantial economic benefit. In addition, embodiments herein can improve the overall electrical efficiency of an oilfield ESP assembly.

DETAILED DESCRIPTION

Figure 1:
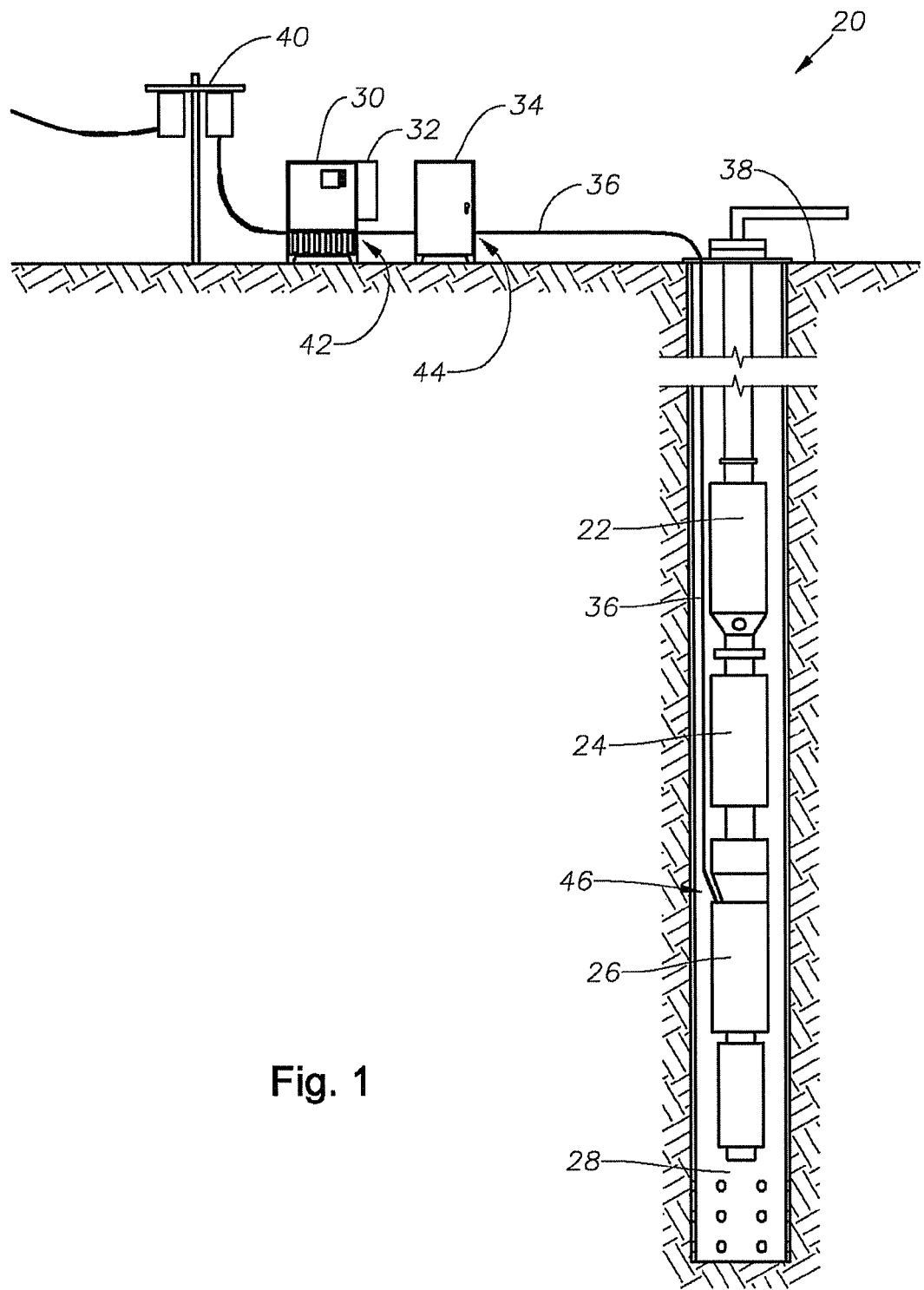
FIG. 1 is a schematic side view of an embodiment of an electrical submersible pump assembly according to an embodiment of the present invention.

The present invention will now be described more fully hereinafter with reference to the accompanying drawings in which embodiments of the invention are shown. This invention may, however, be embodied in many different forms and should not be construed as limited to the illustrated embodiments set forth herein; rather, these embodiments are provided so that this disclosure will be thorough and complete, and will fully convey the scope of the invention to those skilled in the art. Like numbers refer to like elements throughout.

Applicant recognizes deficiencies in the prior art approaches of monitoring and controlling only the primary side of the power system of an electrical submersible pump assembly. Accordingly, example embodiments can provide a method and apparatus to monitor the secondary side voltages of the power system at the surface and to provide downhole electrical imbalance detection for an electrical submersible pump assembly. Applicant further recognizes that monitoring the downhole electrical imbalance voltage can provide insights into the system dynamics and can enable improvements and optimization in the electrical submersible pump assembly.

Example embodiments can provide an apparatus and method for improved diagnostics and performance analysis of electrical submersible pump assemblies using real-time information, including downhole electrical imbalance detection. Example embodiments can provide for electrical imbalance detection by direct voltage monitoring of the secondary side phase voltages of the power system at the surface. Monitoring secondary side phase voltages at the surface, however, does not give full information about the downhole voltages, as there is a long power cable in between these points. Example embodiments can further include monitoring the electrical imbalance voltage at the downhole star point, i.e., neutral point, of the three-phase power system and transmitting the voltage to the surface, perhaps along with the other standard ESP parameters, such as temperature and pressure. The electrical imbalance at the star point can be measured, for example, by using a sense winding on a downhole choke. This measurement provides useful information regarding the initial condition of the system, such as electrical balance, and how this condition changes over time to thereby provide insights into the system dynamics, enable optimization, and improve future well designs.

Example embodiments can also include determining an average electrical imbalance voltage. A constant AC imbalance, that is, a persistent or steady-state imbalance over a given time period, may indicate a non-oscillating system that has imbalance due to, for example, long line of flat cable. Example embodiments can also include evaluating a peak-to-peak electrical imbalance voltage. A noisy AC imbalance may indicate an oscillating system. Such an oscillating system could be caused by rotational shaft flexing while running.

Example embodiments can also provide for utilizing the downhole electrical imbalance voltage to validate and verify a model of a power system of an ESP assembly. A model of a power system of an ESP assembly, including the motor, cable, and drive, can predict the downhole star point voltage, as understood by those skilled in the art. Example embodiments can measure this voltage and transmit the voltage to the surface for analysis to thereby confirm the model, or indicate modifications to the model as necessary. Once verified, the model of an electrical system of an ESP assembly can be used to suggest adjustments to the surface currents to match the downhole motor drive currents. In a preferred embodiment, the downhole motor currents are matched, resulting in no downhole electrical imbalance. Example embodiments can then again measure the downhole electrical imbalance voltage and transmit the voltage to the surface for analysis to thereby confirm the new predictions incorporating the adjustments suggested by the verified model. Without the downhole view of the real system, it is difficult to have enough confidence in any model of the ESP electrical system to make such optimizing adjustments. In practice (without the downhole view), the electrical currents are traditionally set to be equal on the surface.

Benefits of the example embodiments include improved system performance, such as the prevention of failure or increase in the run life of the ESP assembly. Benefits of the example embodiments also include improved energy costs for operating an ESP assembly due to optimization of the power system.

With reference now to FIG. 1, a typical electrical submersible pump assembly 20 includes a centrifugal pump 22, a pump motor 26, and a seal assembly 24 located between the pump 22 and motor 26, all located within a well bore 28. The pump motor 26 can be a three-phase electrical motor. The ESP assembly 20 further includes a power source, e.g., a variable speed drive 30, a controller 32, and an output transformer 34, all located on the surface 38. A cable 36 provides power and communications between the output transformer 34 at the surface and the downhole pump motor 26. An external power source (not shown), such as, for example, a power plant, provides electricity to a variable speed drive 30, often through one or more transformers 40. The variable speed drive 30 then operates as a power source for providing electrical power for driving the motor 26, through an output transformer 34 and cable 36. By altering the output voltage and frequency of the variable speed drive 30, the controller 32 associated with the variable speed drive 30 controls the voltage and frequency at motor 26 terminals.

The power system of typical ESP system can be divided into three main sections: the primary side, surface, as shown at 42; the secondary side, surface, as shown at 44; and the secondary side, downhole, as shown at 46. Those skilled in the art will recognize that the nature of electricity is such that numerous points are equivalent to the locations indicated, including, for example, locations within the variable speed drive 30, locations inside the output transformer 34, and inside the pump motor 26.

Figure 2:
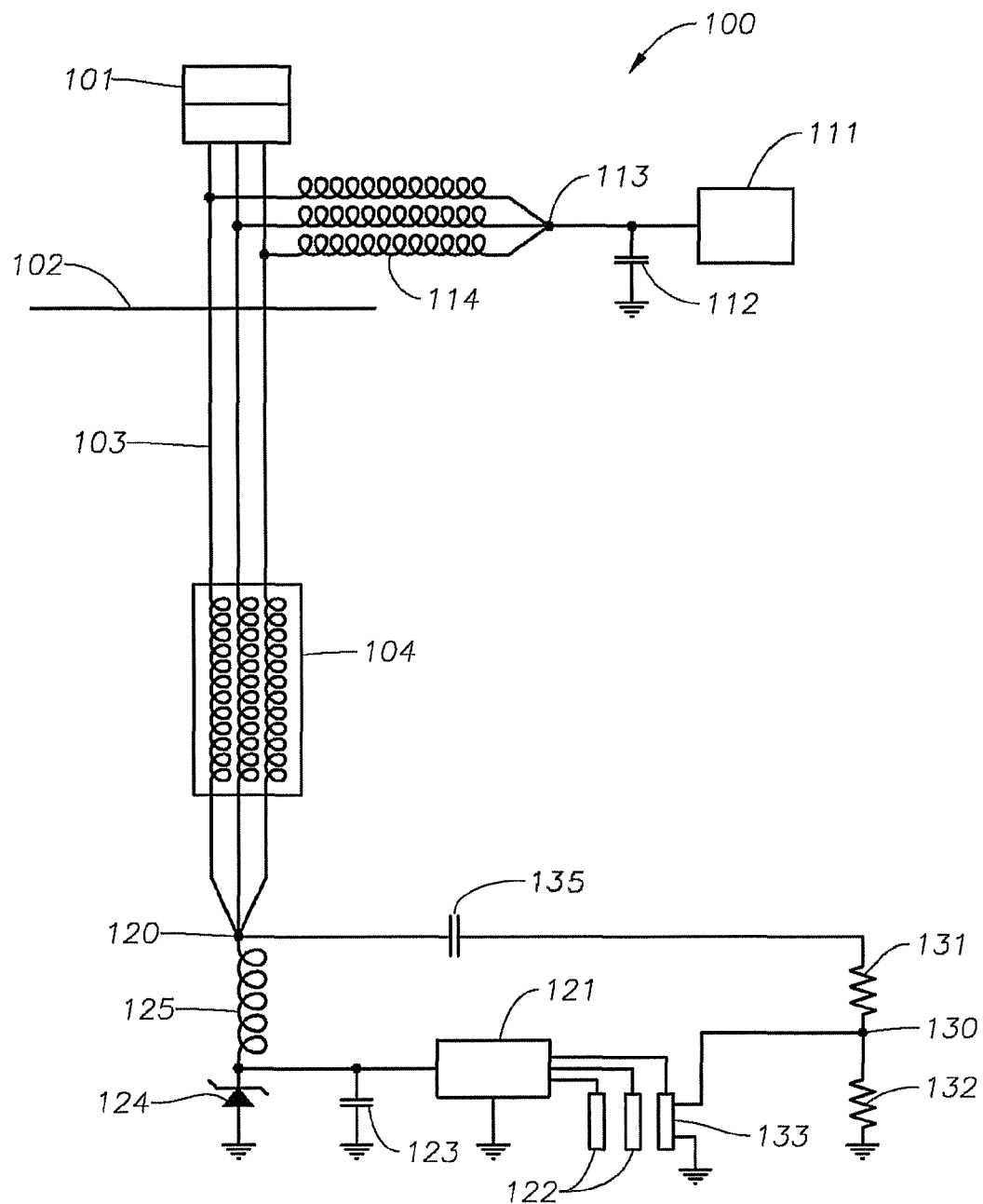
FIG. 2 is a schematic side view of an embodiment of a power system of an electrical submersible pump assembly according to an embodiment of the present invention.

With reference now to FIG. 2, an example embodiment of a power system 100 of an electrical submersible pump assembly can include a power source 101, e.g., an isolated power supply, located on the surface 102, providing power to a downhole motor 104 via a three-conductor power cable 103. The cable 103 can further be utilized as a communications medium as understood by those skilled in the art. An example embodiment of a power system 100 of an electrical submersible pump assembly can also include surface electronics 111 and capacitor 112, attached to neutral point 113 formed by joining three surface inductors 114 together to make a surface star point or neutral point 113. Each of the three surface inductors 114 is electrically connected to a separate conductor of the power cable 103. The surface electronics 111 can provide a steady direct current (DC) voltage using well known methods. The downhole electronics 121 can sink a controlled amount of current using equally well known methods, the amount of current being under the control of the downhole electronics 121. Variations in this current cause a variation in the current drawn from the surface electronics 111. Surface electronics 111 can monitor this current.

An example embodiment of a power system 100 of an electrical submersible pump assembly can also include a downhole instrument, comprising downhole electronics 121, one or more sensors 122 (including, for example, temperature and pressure sensors), a capacitor 123, a zener diode 124, and downhole inductor 125 attached to the neutral point 120 of the downhole motor 104. Hence, the downhole electronics 121 can communicate via inductor 125, motor 104, cable 103, and surface inductors 114 with the surface electronics 111. The one or more sensors 122 can be associated with the downhole electronics 121. The readings from the one or more sensors 122 can be digitized by the electronics 121, which then can encode the readings for transmission to and decoding by the surface electronics 111. For an example of an electrical signaling system, see Patent Application Publication No. US 2008/0212691 A1, published Sep. 4, 2008, which has common inventorship and also ownership with this application.

Example embodiments include the monitoring the star point voltage at point 120 to thereby determine an electrical imbalance. In one embodiment, as illustrated in FIG. 2, resistor 131 and resistor 132 implement a high impedance potential divider so that voltage sensor 133 measures the voltage at point 130 to thereby determine the electrical imbalance voltage at the downhole star point 120. For example, the star point voltage can rise to 3000 VAC in fault conditions. The voltage sensor 133 and electronics 121 can typically accurately measure voltages of the order of 3 V. Using a 1000:1 high impedance divider, such as a 100 Mohm resistor for resistor 131 and a 100 kohm resistor for resistor 132, for example, allows the voltage sensor 133 to determine the imbalance voltage at the star point 120. Downhole capacitor 135 provides that only AC voltage is measured by the high impedance divider.

Alternatively, inductor 125 can include a sense winding. In a preferred embodiment, the sense winding has approximately 1000th the number of turns as the inductor so that the AC voltage induced on the sense winding is at a suitable level for measurement by the downhole electronics 121. Those skilled in the art will recognize other mechanisms and means to measure or determine the electrical imbalance voltage at the downhole star point 120 as within the embodiments. The voltage measurement can then be digitized by the electronics and transmitted to the surface. Those skilled in the art will recognize alternatives to the power cable for communications, such as radio frequency transmissions, separate communication cables, and other communications paths systems.

Figure 3:
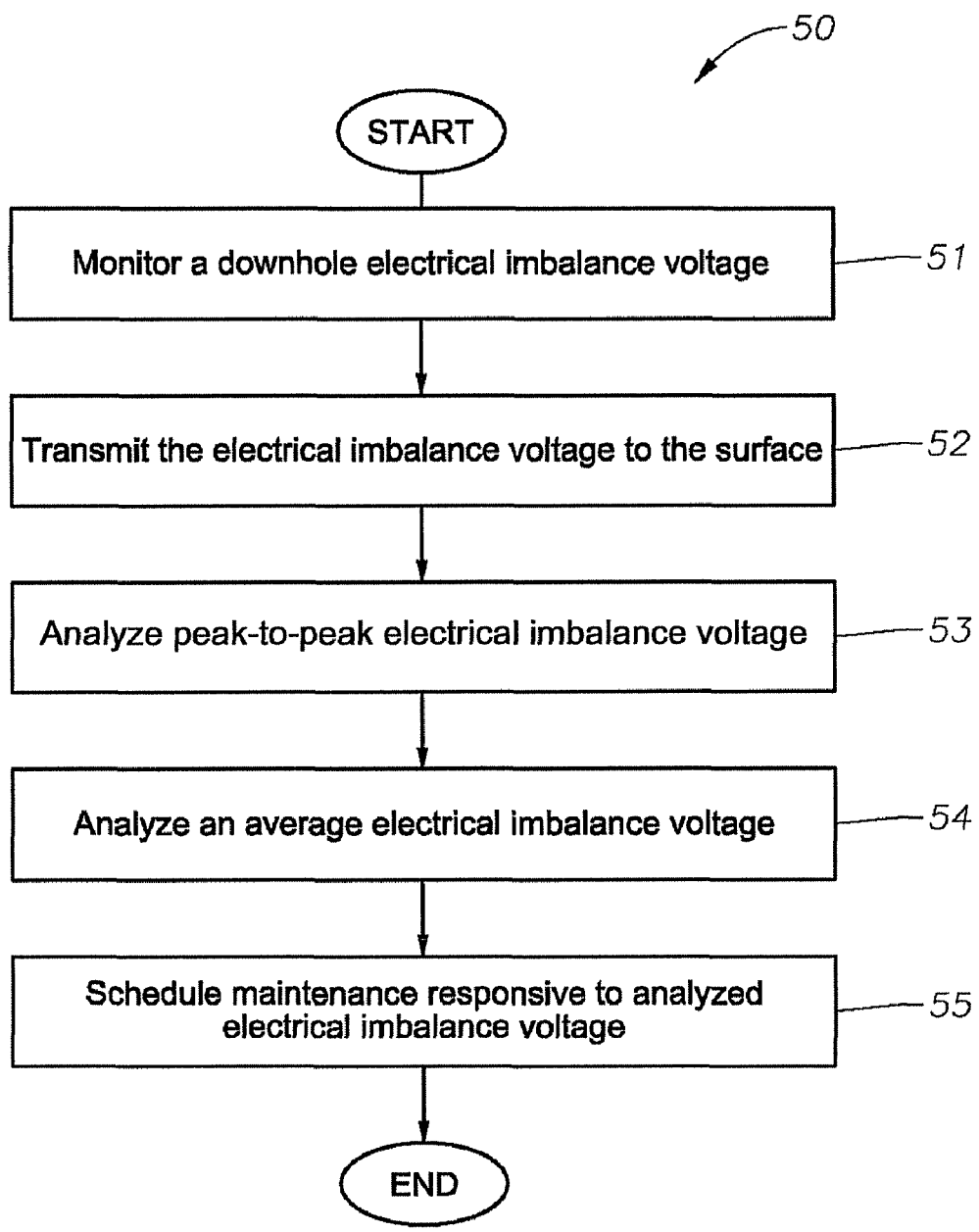
FIG. 3 is a flow diagram of method of monitoring a power system of an electrical submersible pump assembly according to an embodiment of the present invention.

With reference now to FIG. 3, an embodiment of the present invention includes a computer-implemented method 50 of monitoring a power system of an electrical submersible pump assembly. The computer-implemented method can include monitoring a downhole electrical imbalance voltage 51 at the neutral point, or star point, of a motor of an electrical submersible pump assembly. The downhole electrical imbalance voltage can be determined through a sense winding on a downhole inductor attached to the downhole neutral point. Alternately, the downhole electrical imbalance voltage can be determined by utilizing a high-impedance potential divider. The computer-implemented method can include transmitting the value of the downhole electrical imbalance voltage to the surface 52. The computer-implemented method can include analyzing a peak-to-peak electrical imbalance voltage 53 and an average electrical imbalance voltage 54. The computer-implemented method can also include adjusting an operation of the electrical submersible pump assembly responsive to the analyzed electrical imbalance voltage, including, for example, scheduling maintenance responsive to the analyzed electrical imbalance voltage 55. As understood by those skilled in the art adjusting an operation of the electrical submersible pump assembly can include altering a voltage or frequency at the motor by adjusting a voltage of frequency from the power source, and changing an effective transmission impedance for the cable through a transformer or capacitor, either manually or automatically, i.e., programmatically.

Figure 4:
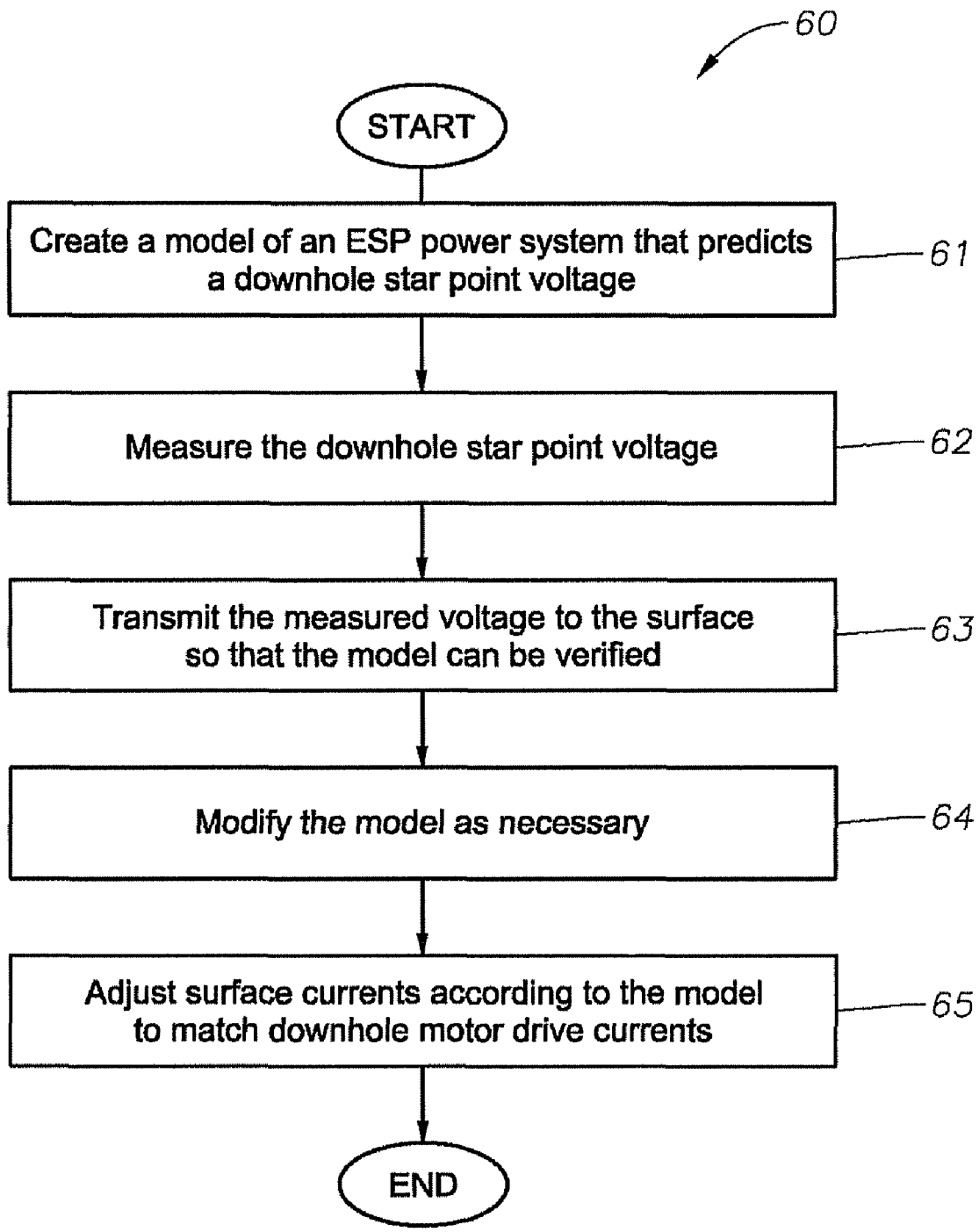
FIG. 4 is a flow diagram of method of optimizing a power system of an electrical submersible pump assembly according to an embodiment of the present invention.

With reference now to FIG. 4, an embodiment of the present invention includes a computer-implemented method 60 of monitoring a power system of an electrical submersible pump assembly. The computer-implemented method can include creating a model of an ESP power system that predicts a downhole star point voltage 61. The computer-implemented method can include measuring the downhole star point voltage 62 and transmitting the measured voltage to the surface so that the model can be verified 63. The computer-implemented method can include modifying the model as necessary 64. The computer-implemented method can include adjusting surface currents according to the verified model to balance downhole motor drive currents 65 to thereby optimize the power system.

Figure 5:
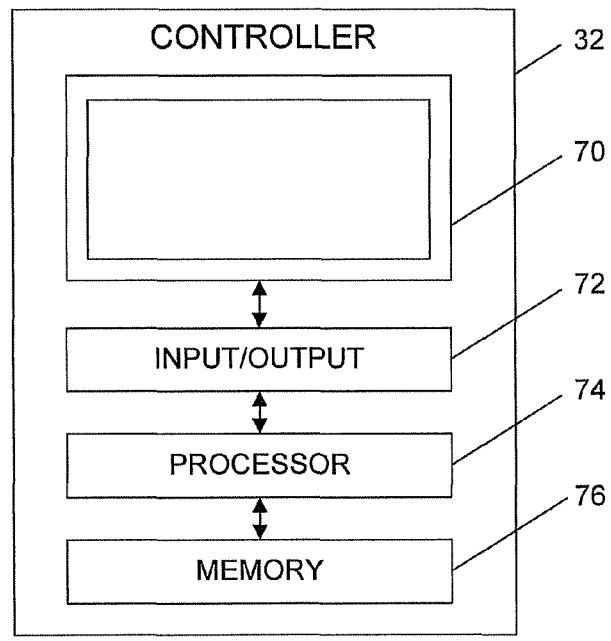
FIG. 5 is schematic diagram of a controller according to an embodiment of the present invention.

With reference now to FIG. 5, a controller 32 according to the present invention is illustrated schematically. The controller 32 can analyze the alternating current component of the downhole electrical imbalance voltage, can schedule maintenance responsive to measurement from the sensor, and can adjust surface currents according to the modified model to match downhole motor drive currents. The controller 32 includes a memory 76 storing data from the sensor, models of the power system as described herein, and the set of instructions shown in FIG. 6, as will be described. The controller 32 also includes a processor 74 for responding to commands from an operator or internally within the processor and otherwise operating the controller. The controller 32 includes an input/output unit 72 for transferring information or data, as well as commands to the controller 32 from an operator. The controller 32 can also include a display 70.

Figure 6:
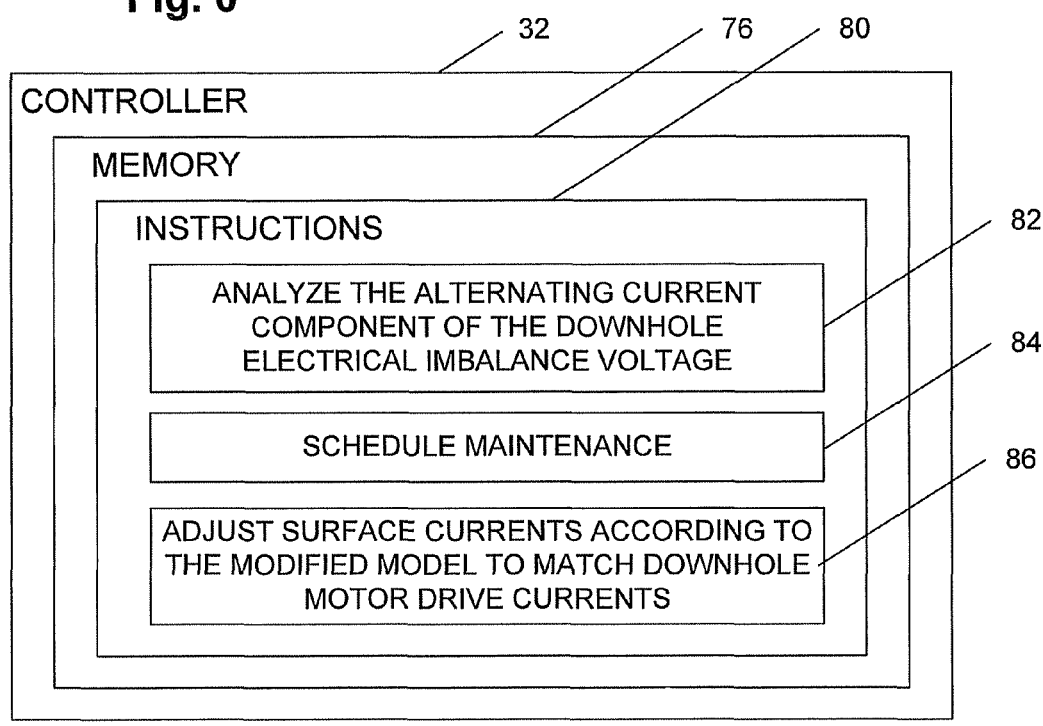
FIG. 6 is schematic diagram of a program product stored in a computer readable memory according to an embodiment of the present invention.

With reference now to FIG. 6, the controller 32 can include a memory 76, and the memory can include therein a program product. The program product is operable on the controller 32 and stored in the memory 76; the program product includes a set of instructions 80 that, when executed by the controller 32, cause the controller 32 to perform various operations. The operations can include analyzing the alternating current component of the downhole electrical imbalance voltage responsive to a measurement from the sensor 82. The operations can include scheduling maintenance for the electrical submersible pump assembly responsive to the analyzed alternating current component of the downhole electrical imbalance voltage 86. In addition, the operations can include adjusting surface currents according to the model of the power system to match downhole motor drive currents to thereby optimize the power system 86. Other operations and method steps as described herein are also within the scope of the embodiments of the present invention, as understood by those skilled in the art. (See, e.g., FIG. 4.)

It should be understood that various types of computer readable media are available and adapted for storage of the program product according to the embodiments of the present invention. Such forms of computer readable media include but are not limited to tangible storage media, such as non-volatile, hard-coded type media such as read only memories (ROMs), CD-ROMs, and DVD-ROMs, or erasable, electrically programmable read only memories (EEPROMs), recordable type media such as floppy disks, hard disk drives, CD-R/RWs, DVD-RAMs, DVD-R/RWs, DVD+R/RWs, flash drives, memory sticks, and other newer types of memories; as well as transmission type media such as digital and analog communication links. The data stored in such media can include sensor data and models of power systems, as well as instructions related to operation of the controller 32 and performance of the method steps described above. It should also be understood that such media can be at other locations instead of or in addition to the locations described above to store program products, e.g., including software, thereon.

This application claims priority to and the benefit of U.S. Provisional Patent Application No. 61/140,261, filed Dec. 23, 2008, titled "Downhole Electrical Imbalance Detection," which is incorporated herein by reference in its entirety.

While the invention has been shown or described in only some of its forms, it should be apparent to those skilled in the art that it is not so limited, but is susceptible to various changes without departing from the scope of the invention. For example, various components and/or designs can be utilized to implement the algorithms described herein or a variation of these algorithms. As such, those skilled in the art will appreciate that the operation and design of the present invention is not limited to this disclosure nor a specific embodiment discussed herein, but is susceptible to various changes without departing from the spirit and scope of the invention. In the drawings and specification, there have been disclosed illustrative embodiments of the invention and, although specific tennis are employed, they are used in a generic and descriptive sense only and not for the purpose of limitation.

That claimed is:

1. A method of monitoring a power system of an electrical submersible pump assembly, the method comprising:
    monitoring an alternating current component of a downhole electrical imbalance voltage at a neutral point of a motor of an electrical submersible pump assembly, the electrical submersible pump assembly including a pump in the well bore, the motor located in the well bore and attached to the pump, a power source located at the surface, and a power cable to connect the motor to power source;
    transmitting the alternating current component of the downhole electrical imbalance voltage to the surface;
    wherein the step of transmitting the alternating current component of the downhole electrical imbalance voltage to the surface involves transmitting one or more of the following: a peak-to-peak electrical imbalance voltage, and an average electrical imbalance voltage;
    analyzing the alternating current component of the downhole electrical imbalance voltage; and
    adjusting an operation of the electrical submersible pump assembly responsive to the analyzed alternating current component of the downhole electrical imbalance voltage.

2. A method of claim 1, wherein the step of monitoring the alternating current component of the downhole electrical imbalance voltage further includes a high-impedance potential divider capacitively coupled to the neutral point and a voltage sensor.

3. A method of claim 1, wherein the step of analyzing the alternating current component of the downhole electrical imbalance voltage indicates an oscillating system responsive to a large peak-to-peak electrical imbalance voltage.

4. A method of claim 1, wherein the step of analyzing the alternating current component of the downhole electrical imbalance voltage indicates a non-oscillating system responsive to a persistent electrical imbalance voltage.

5. A method of claim 1, wherein the power source comprises a variable speed drive and an output transformer connected to the variable speed drive.

6. A method of monitoring a power system of an electrical submersible pump assembly, the method comprising:
    creating a model of a power system of an electrical submersible pump assembly to predict an alternating current component of a downhole electrical imbalance voltage at a neutral point of a motor of the electrical submersible pump assembly, the electrical submersible pump assembly including a pump in the well bore, the motor located in the well bore and attached to the pump, a power source located at the surface, and a power cable to connect the motor to the power source;

measuring the alternating current component of the downhole electrical imbalance voltage at the neutral point of the motor of the electrical submersible pump assembly;

transmitting the alternating current component of the downhole electrical imbalance voltage to the surface so that the model of the power system can be verified;

wherein the step of transmitting the alternating current component of the downhole electrical imbalance voltage to the surface involves transmitting one or more of the following: a peak-to-peak electrical imbalance voltage, and an average electrical imbalance voltage;

modifying the model of the power system as necessary; and adjusting surface currents according to the model of the power system to match downhole motor drive currents to thereby optimize the power system.

7. A method of claim 6, wherein the step of measuring the alternating current component of the downhole electrical imbalance voltage further includes a high-impedance potential divider capacitively coupled to the neutral point and a voltage sensor.

8. A method of claim 6, wherein the power source comprises a variable speed drive and an output transformer connected to the variable speed drive.

9. An electrical submersible pump assembly, comprising:
a pump located in a well bore,
a motor located in the well bore and attached to the pump,
a power source located at the surface of the well bore,
a power cable to connect the motor to the power source;
a downhole sensor to measure an alternating current component of a downhole electrical imbalance voltage at a neutral point of the motor;
a controller to analyze the alternating current component of the downhole electrical imbalance voltage, the controller having at least a processor and a tangible memory; and
a program product operable on the controller and stored in the memory, the program product comprising a set of instructions that, when executed by the controller, cause the controller to perform the operations of:
analyzing the alternating current component of the downhole electrical imbalance voltage responsive to a measurement from the sensor, wherein analyzing the alternating current component of the downhole electrical imbalance voltage responsive to a measurement from the sensor involves one or more of the following: a peak-to-peak electrical imbalance voltage, and an average electrical imbalance voltage, and
adjusting an operation of the electrical submersible pump assembly responsive to the analyzed alternating current component of the downhole electrical imbalance voltage.

10. An electrical submersible pump assembly of claim 9, wherein operations further include:
creating a model of a power system of the electrical submersible pump assembly to predict the alternating current component of the downhole electrical imbalance voltage at the neutral point of the motor;
verifying the model of the power system responsive to a measurement from the sensor;
modifying the model of the power system as necessary; and
adjusting surface currents according to the model of the power system to match downhole motor drive currents to thereby optimize the power system.

11. An electrical submersible pump assembly of claim 9, wherein the power source comprises a variable speed drive and an output transformer connected to the variable speed drive.

* * * * *